United States Patent [19]

Bonnerot

[11] 4,361,893
[45] Nov. 30, 1982

[54] TRANSMISSION SYSTEM USING DIFFERENTIAL PULSE CODE MODULATION

[75] Inventor: Georges Bonnerot, Orsay les Ulis, France

[73] Assignee: Telecommunications Radioelectriques et Telephoniques T.R.T., Paris, France

[21] Appl. No.: 94,408

[22] Filed: Nov. 15, 1979

[30] Foreign Application Priority Data

Nov. 17, 1978 [FR] France ............................. 7832508

[51] Int. Cl.³ .......................................... H03K 13/22
[52] U.S. Cl. ................................. 375/27; 332/11 D; 364/724
[58] Field of Search ...................... 375/27–33; 332/11, 11 D; 340/347 AD; 333/14; 179/15.55 R; 364/724

[56] References Cited

U.S. PATENT DOCUMENTS 3,502,986  3/1970  Lucky .................................... 375/27
3,689,840  9/1972  Brown ................................... 375/27
3,973,199  8/1976  Widmer .................................. 375/30

Primary Examiner—Benedict V. Safourek
Assistant Examiner—Stephen Chin
Attorney, Agent, or Firm—Thomas A. Briody; William J. Streeter; Edward W. Goodman

[57] ABSTRACT

This system comprises an encoder in which the differential PCM signal to be transmitted is formed as the difference between the incoming linear PCM signal and a prediction signal produced by a prediction filter comprising a local decoder receiving the said differential PCM signal. According to the invention the local decoder and the remote decoder are constructed in an identical manner by means of one or several filtering sections arranged in cascade, each filtering section being of the purely recursive or non-recursive type with one sole coefficient differing from zero and having been provided with its own roundoff (or truncation) device having a step size equal to the quantizing step of the differential PCM signal, the incoming linear PCM signal being rounded (or truncated) in the same manner. This construction enables the cascade arrangement of encoders and decoders without any further degradation of the signal then the degradation produced by the first coding.

10 Claims, 16 Drawing Figures

TRANSMISSION SYSTEM USING DIFFERENTIAL PULSE CODE MODULATION

BACKGROUND OF THE INVENTION

The invention relates to a digital information transmission system using differential pulse code modulation and comprising an encoder in which the differential PCM signal to be transmitted is formed as the difference between the incoming linear PCM signal and a prediction signal obtained from a prediction filter comprising a local decoder receiving said differential PCM signal.

It is a known fact that in digital transmission networks normalized by the CEPT, the transmitted signals in each path are formed from 8-bit words which appear at a 8 kHz sampling rate, which produces a bit stream of 64 k bits/s in each path. Each 8-bit word results from compression in accordance with an approximate logarithmic law of each signal sample to be transmitted, coded linearly with 12 bits by means of pulse code modulation (PCM).

At present, endeavours are made to reduce in digital transmission networks, the bit stream in each path, with the aim of increasing the transmission capacity of these networks. A means to accomplish this, which is described in Italian Patent Specification No. 984,398 consists in deriving from the normalized PCM signal a differential PCM signal which is formed by means of the differential pulse code modulation technique and suitable for transmission with a reduced number of bits. In accordance with this technique, a differential digital PCM signal is obtained in an encoder by quantizing a difference signal between the linearized PCM signal and a prediction signal; this prediction signal is obtained from the output of a local decoder to which the differential PCM signal is applied, this signal being transmitted to the remote decoder. By using inter alia a syllabic compression system to match the size of the quantizing step of the difference signal to the level of this difference signal, it is theoretically possible to obtain a 4-bit differential PCM signal of a satisfactory quality which enables the transmission to the remote decoder with a bit stream of 32 k bits/s, thus doubling the capacity of a transmission path designed for a bit stream of 64 k bits/s.

However, the use of differential PCM signals for the transmission in existing networks presents problems which apparently have not yet been resolved. In the junction centres of the network, switching is to be effected on the compressed PCM signals, standardized at 8 bits, so that each connection requires a cascade of conversions of the PCM signal, compressed to 8 bits, into a differential PCM signal and of the differential PCM signal into the PCM signal, compressed to 8 bits. For the first-mentioned type of conversion an expander must be provided which produces the linear PCM signal to be applied to a differential PCM encoder of the above described type. For the second type of conversion a compressor must be provided at the output of the remote differential PCM decoder for converting the linear PCM signal produced by this decoder into a compressed 8-bit PCM signal.

In a link using a cascade of PCM to differential PCM conversions and the other way around, there is a risk of accumulation of noise produced at each conversion and inherent to the digital character of the processed signals. Particularly, the encoders and decoders for differential PCM signals comprise digital filters; a filter which is identical to the filter of the local decoder, included in the encoder for forming the prediction signal, must be provided in the remote decoder for forming the coded signal; similarly, a filter identical to the syllabic filter included in the encoder forming the quantizing step matching signal, must be provided in the distant decoder; the corresponding filters must of course produce the same signal in response to the same signal. It is a known fact that digital filters, even when the same signal is applied to them, may furnish different signals because of their internal memory. It is clear that if this is also the case for the corresponding filters of the encoders and the distant decoders the differential PCM transmission is not possible without degradation. Moreover, if no precaution is taken in the encoders and decoders to effect the necessary limitation of the number of bits (by means of rounding or truncation), there is the risk of an accumulation of noise resulting from these limiting operations during each PCM differential PCM conversion and inversely. A further risk of accumulation of the noise produced during each conversion resides in the required expanding and compression operation in a link which uses a cascade of conversion. All this may cause an impermissible degradation in the signal in a link using differential PCM signals for the transmission.

SUMMARY OF THE INVENTION

It is an object of the present invention to obviate these drawbacks. This is accomplished by the fact that no degradation of the signal other than the degradation caused by one single conversion is caused in a link which requires a certain number of PCM-to-differential PCM conversions.

According to the invention, in a transmission system using differential pulse code modulation, the local decoder and the distant decoder are of an identical construction, comprising one or several filter sections arranged in cascade, each filter section being of the purely recursive or non-recursive type, having one sole coefficient which differs from zero and each comprising its own rounding (or truncation) device having a step which is equal to the quantizing step of the differential PCM signal, the incoming linear PCM signal being rounded (or truncated) in the same manner.

In the detailed description of the system according to the invention it will be described that the local decoder and the distant decoder which are of the above-defined construction are brought into line after a limited period of time (that is to say they furnish the same signal after a limited period of time provided they have received the same signal) when any signal, for example a voice signal or a data signal is applied to the encoder. Consequently, after the period of time necessary for this alignment, the distant decoder produces the same linear PCM signal as applied to the coder, which enables the cascade arrangement of the coders and decoders to operate without any further degradation of the signal other than the degradation produced by the first coding.

The prediction signal can be obtained in the encoder by simply arranging the rounding (or truncation) devices of the filter sections of the local decoder at the output of the multiplying circuits of these filter sections, the prediction signal being formed as the sum of the signals obtained from these rounding (or truncation) devices.

As in the transmission system according to the invention this quantizing step of the differential PCM signal is automatically controlled by means of identical compression networks included in the local decoder and in the distant decoder, the syllabic filters included in these compression circuits have also the same construction as the above-described filters. Thus, after a limited period of time necessary for the alignment of the syllabic filter, the encoder and the distant decoder operate with the same quantizing step, which enables the cascade arrangement of the coder and the decoders with a variable quantizing step.

DESCRIPTION OF THE DRAWINGS

The invention and its advantages will now be further described by way of non-limitative example with reference to the drawings attached.

Figure 5:
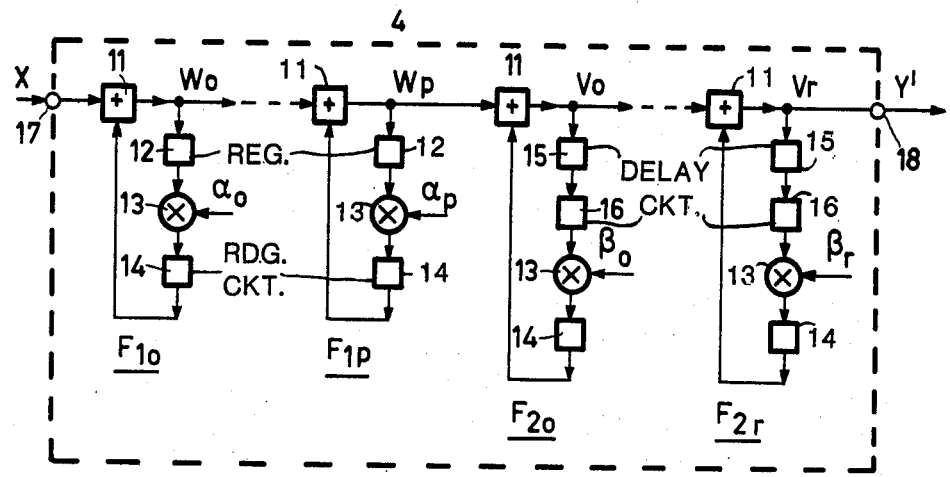
Figure 6:
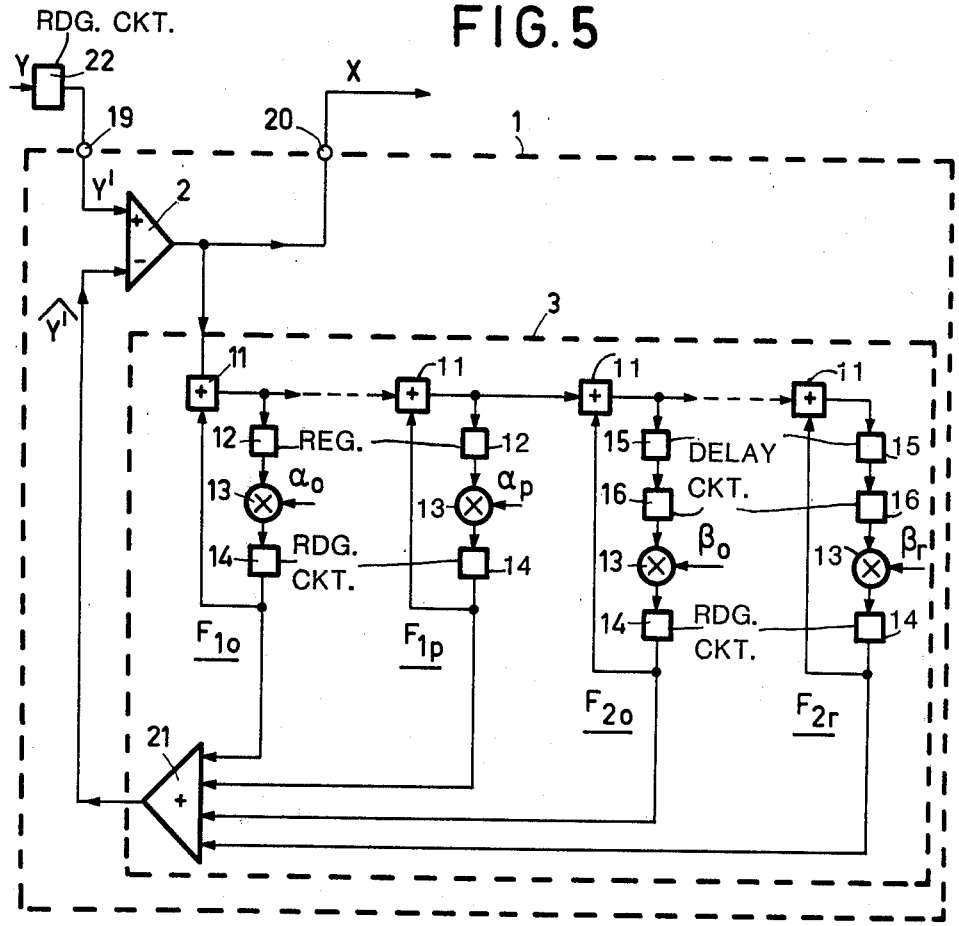

The FIGS. 5 and 6 are circuit diagrams showing an embodiment of a decoder and an encoder, respectively, in a system according to the invention.

Figure 7:
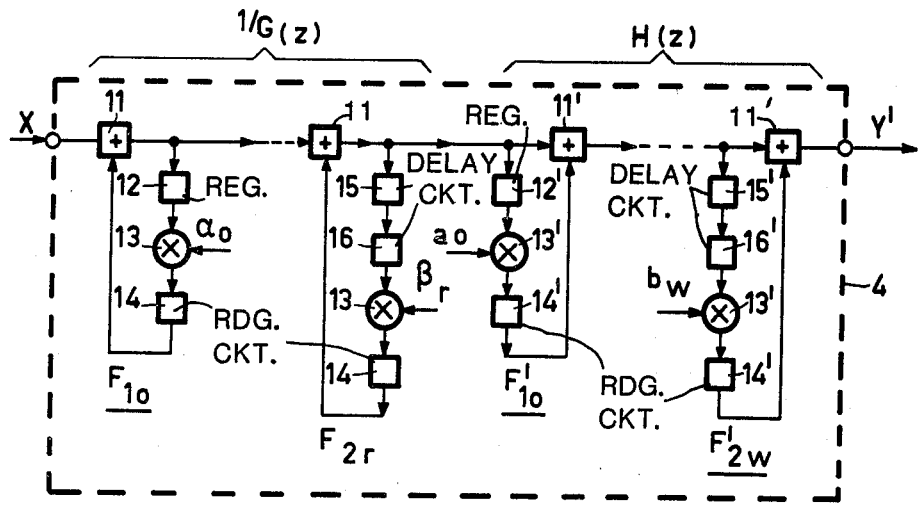
Figure 8:
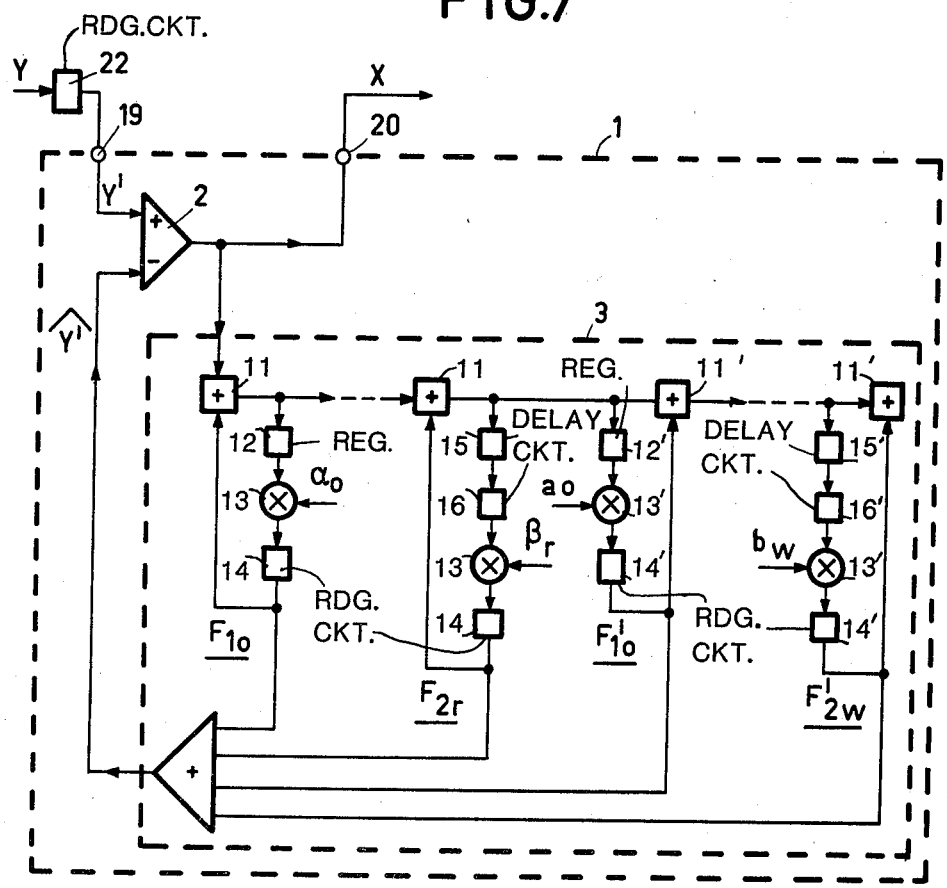

FIGS. 7 and 8 show schematically a further embodiment of a decoder and an encoder in the system according to the invention.

Figure 9:
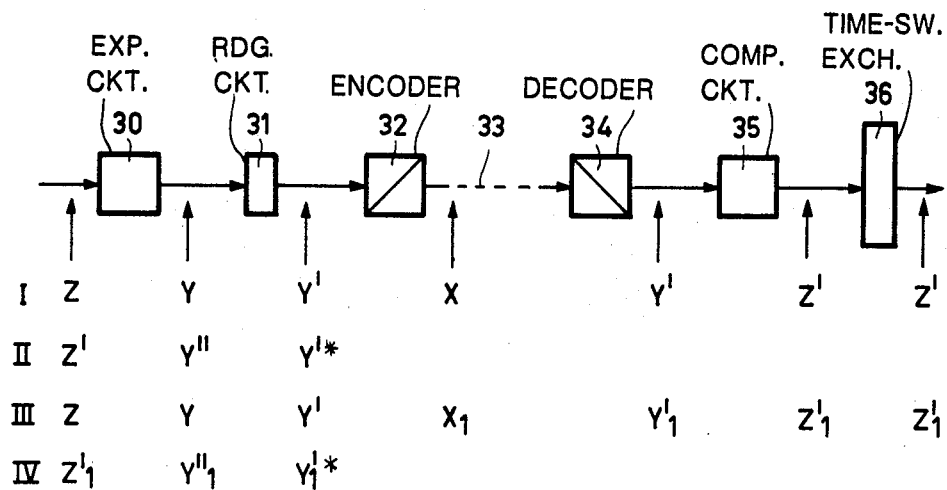

FIG. 9 shows by means of a simplified block diagram the components necessary for the conversion in cascade of a compressed PCM signal into a differential PCM signal and vice versa.

Figure 10:
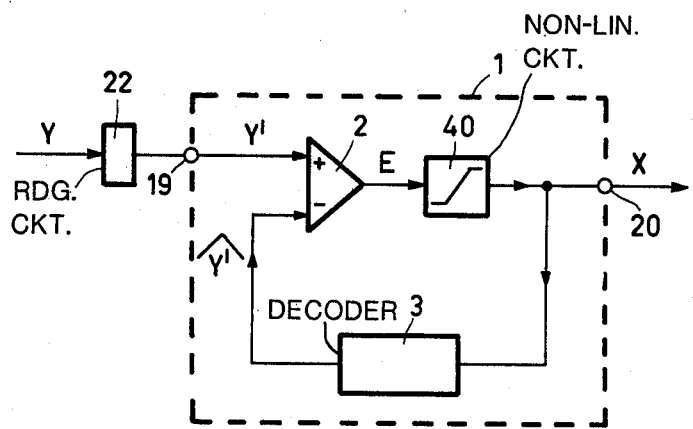

FIG. 10 shows schematically the known overall construction of an encoder comprising a non-linear circuit with saturation overflow.

Figure 11:
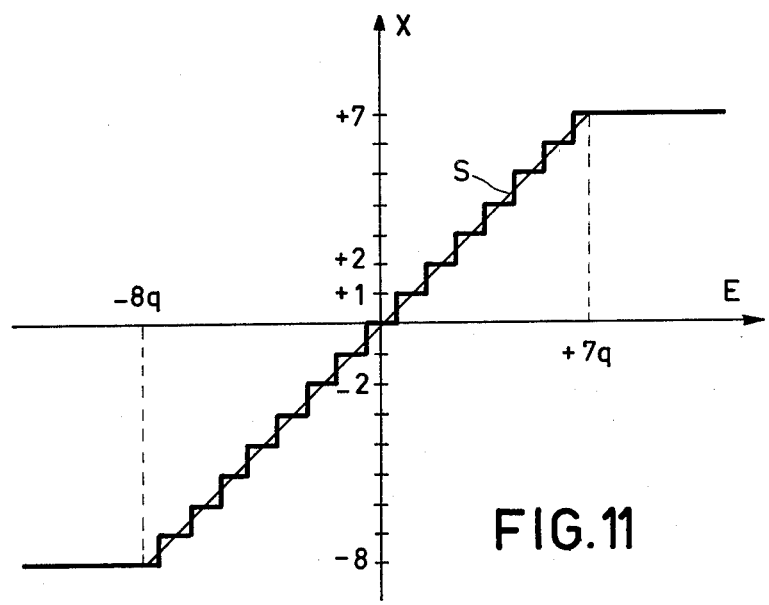
Figure 12:
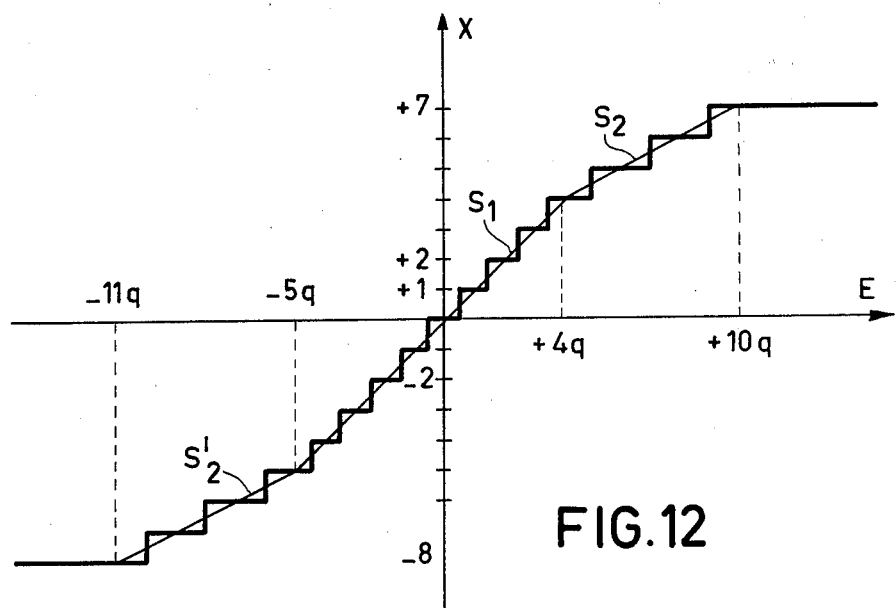

FIGS. 11 and 12 are diagrams showing the response curves of a linear quantizer and of a non-linear quantizer, respectively.

Figure 13:
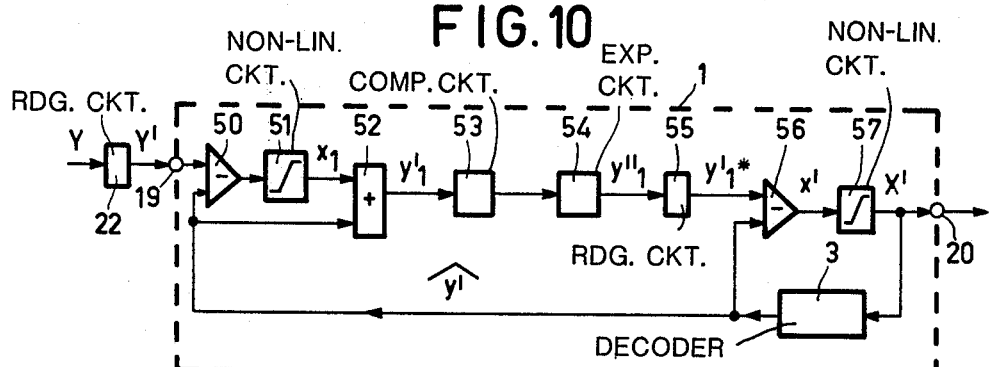

FIG. 13 shows schematically an encoder according to the invention which has for its object to mitigate the drawbacks resulting from the clipping operation by means of the encoder of FIG. 10.

Figure 14:
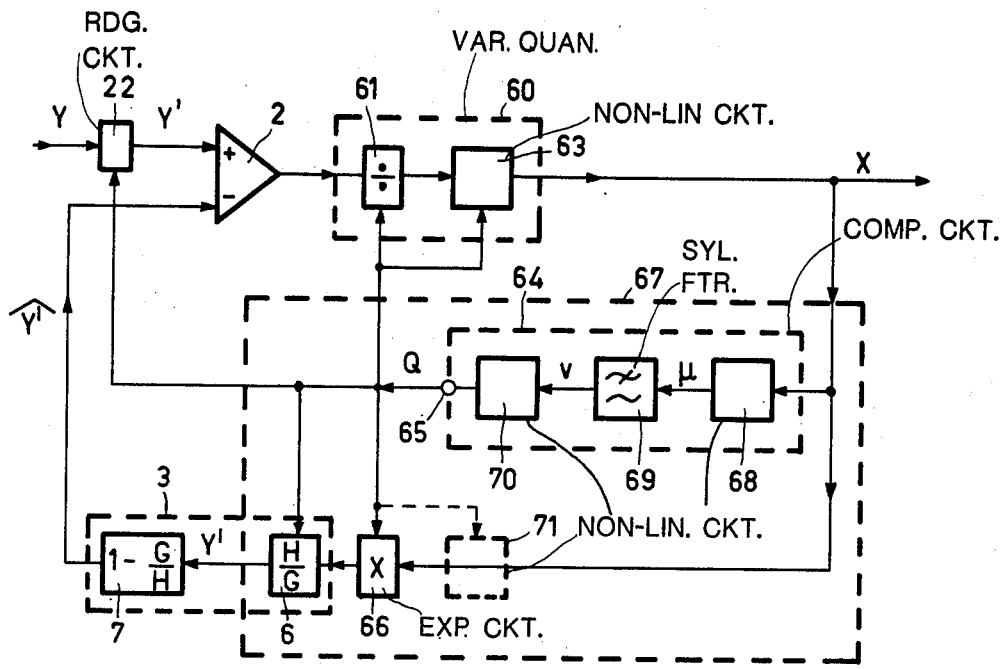
Figure 15:
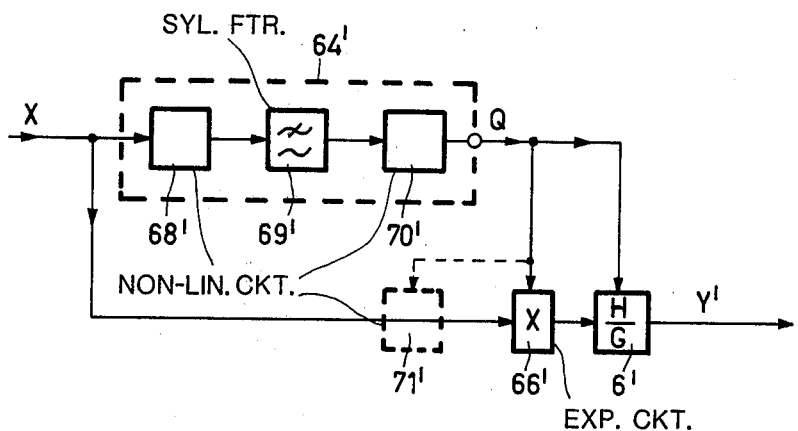

FIGS. 14 and 15 are the circuit diagrams of an encoder and an associated distant decoder in a transmission system according to the invention, using a variable quantizing step.

Figure 16:
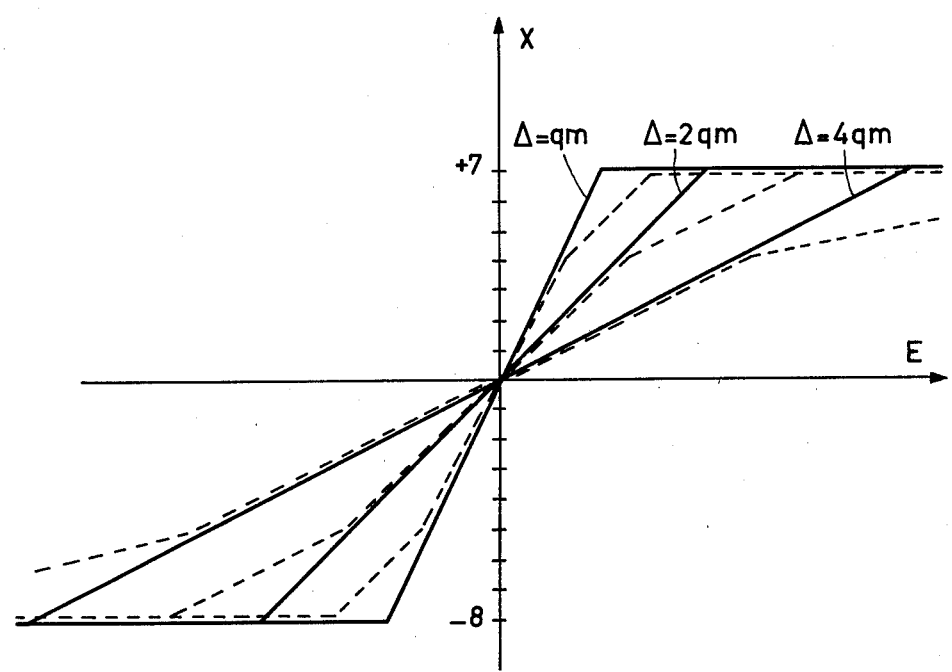

FIG. 16 is a diagram showing the various possible responses for the variable quantizer used in the encoder of FIG. 14.

DESCRIPTION OF THE PREFERRED EMBODIMENTS

Figure 1:
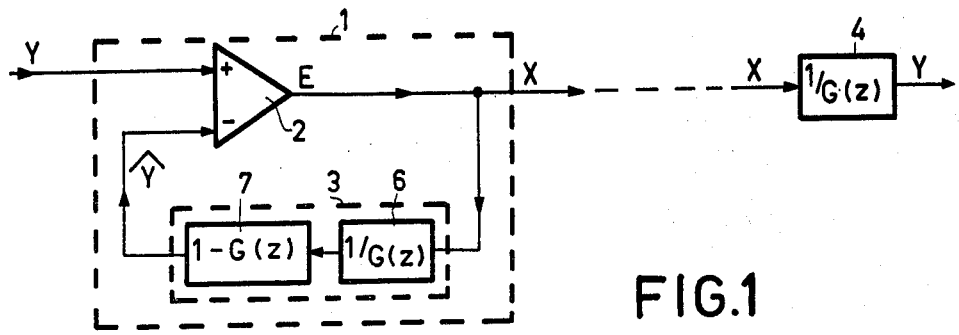
FIG. 1 shows schematically the encoder and the associated distant decoder in a differential PCM transmission system.

An encoder and the associated distant decoder in a transmission system using differential pulse code modulation may be represented by the simplified circuit diagram of FIG. 1.

The PCM signal Y formed by linearly coded 12-bit samples is applied to the input of the encoder 1. This signal Y is applied to an input (+) of a differential circuit 2 whose other input (−) receives a prediction signal Ý. The prediction signal Ý is formed at the output of the prediction filter 3 which receives the output signal X of the encoder. This differential PCM signal X is also applied to the distant decoder 4, which must normally furnish the same signal Y as that applied to the input of encoder 1. Let it be assumed that the output signal X of the encoder is the same as the difference signal E at the output of the difference circuit 2, whereas the signal X is normally obtained in response to quantization of the signal E with, for example, 4 bits, as will be explained hereinafter.

The prediction filter 3 comprises the cascade arrangement of a local decoder 6, which receives the same signal X as the remote decoder 4, and an output filter 7 which supplies the prediction signal Y. The remote decoder 4 and the local decoder 6 have the transfer function of a filter, for example of a purely recursive filter, which may be represented, on the basis of the Z transforms of the signals, by the transfer function to $Z = 1/G(z)$. The encoder 1 must of course have the transfer function which is the opposite of that of the remote decoder 4; in the present example this transfer function of the encoder is $G(z)$, that is to say the function of a non-recursive filter, and it is evident that the output filter 7 must therefore effect the operation $[1-G(z)]$.

The use of digital filters to realize the decoders 4 and 6 introduces problems which may render the system of FIG. 1 unfit for use, particularly in a link comprising the cascade arrangement of several of these systems. Actually, certain digital filters, even when they receive the same signal, may produce different signals in certain circumstances. If the filters forming the remote decoder 4 and the local decoder 6 behave accordingly, a signal different from the applied to the encoder 1 is present at the output of the remote decoder 4. In a link comprising a cascade arrangement of encoders and decoders an accumulation of noise must furthermore be avoided, this noise being produced by the limiting operation of the number of bits to be effected in each encoder and decoder.

The invention provides means to avoid these drawbacks by prescribing the structure of the digital filters to be used and the measures to be taken in these filters to effect the limiting operations of the number of bits.

Let us first discuss in a general manner the type of filters suitable for use. A distinction is made between non-recursive filters whose transfer function to Z has only zeros, and purely recursive filters whose transfer function to Z has poles only.

As regards the non-recursive filters, it is a known fact that their output only depends on a finite number of consecutive input numbers. Consequently, if two identical filters of this type are considered to which the same input signal is applied, but starting from different initial conditions, that is to say with different numbers stored in the internal memories, it is a certainty that the two filters will furnish the same output signal at the end of a finite period of time which corresponds to the complete renewal of the said stored numbers. To denote this property the non-recursive filters might be called "absolutely convergent" filters.

As regards the purely recursive filters, it is a known fact that at any instant their output does not only depend on a finite number of consecutive integers but also on a finite number of preceding output numbers. Consequently, such a type of filter preserves the initial conditions of the memory and there is no absolute certainty that two identical filters of this type to which the same input signal is applied, but starting from different initial conditions, will furnish the same output in a finite period of time.

In contrast therewith it is possible to guarantee for certain types of purely recursive filters that the probability that the same output is obtained for the same input signal tends to 1 versus the time. Filters of this type will be called "statistically convergent" filters hereinafter.

Figure 2:
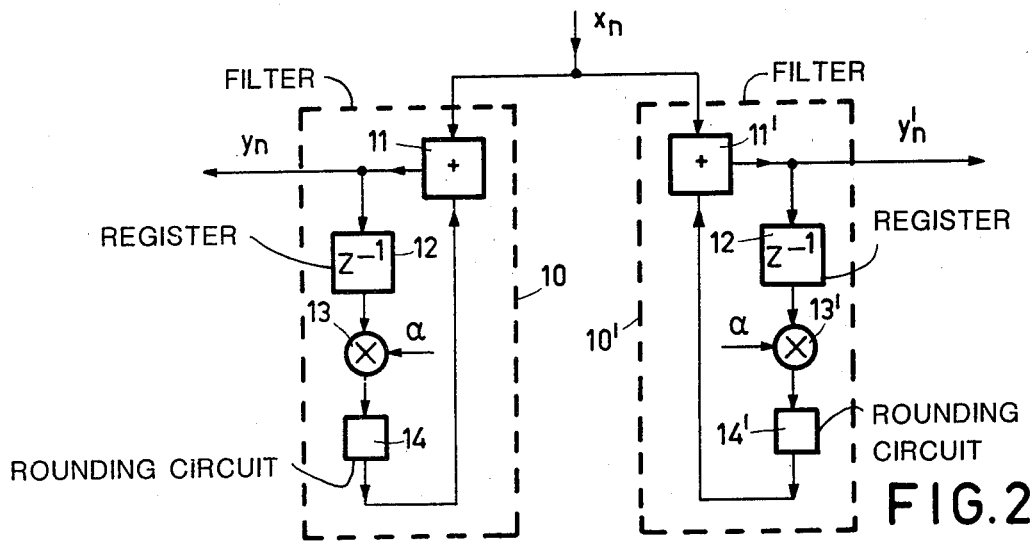
FIG. 2 shows schematically two purely first-order recursive filters whose inputs are interconnected.

The first-order purely recursive filters having the transfer function $1/(1-Z^{-1}\alpha)$ (wherein $\alpha$ is the coefficient of the filter) are a first type of statistically convergent filters. To show this, FIG. 2 shows two identical filters 10, 10' of this type, which receive the same input signal $x_n$, wherein n is an index representing the time at the instants nT, which is a multiple of the sampling period T. The Figure shows that each filter 10, 10' comprises an adder circuit 11, 11' one input of which receives the signal $x_n$ and the output of which is connected to a register 12, 12' which produces a delay T (function $Z^{-1}$), followed by a multiplying circuit 13, 13' for multiplication by the coefficient $\alpha$, the number of bits of the product formed, the output of which being limited by a circuit 14, 14'. For simplicity it is assumed hereinafter that the operation to limit the number of bits are roundoff operations, everything being said on this subject also holding for truncations. The output of the circuit 14, 14' is connected to the other input of the adder circuit 11, 11'. The outputs of the filters 10 and 10' are connected to the outputs of the adder circuits 11 and 11'. The output signals at the instants nT are denoted $y_n$ and $y'_n$, respectively.

Let is be assumed that at the initial instant n=0, the content of the two delay circuits 12, 12' is $y_o$ and $y'_o$, respectively, $y_o - y'_o \neq 0$.

When a coefficient $\alpha = 1$ is used for the two filters, the output signals will always remain different, as the initial deviation $y_o - y'_o$ will indefinitely be preserved.

When, in contrast therewith, a coefficient $\alpha < 1$ is used for the two filters, the deviation between their output signals would decrease considerably when the rounding circuits 14, 14' were not present. But, as all the operations in these filters are effected digitally, these rounding circuits are necessary to limit the number of bits resulting from the computations effected at each sampling period and it is advisable to investigate in what conditions it is possible to obtain convergence of the two filters by means of roundoff operations.

Figure 3:
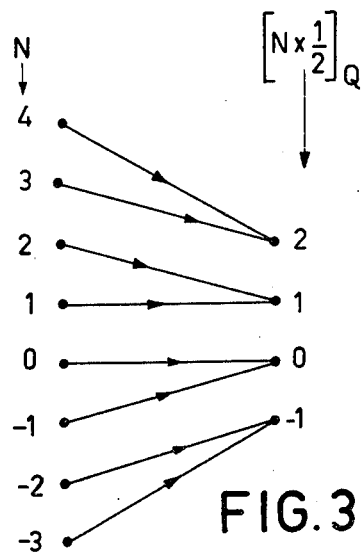
FIG. 3 is a diagram having for its object to show how the two filters of FIG. 2 can be aligned.

Let is be assumed, for simplicity of the explanation, that the coefficient $\alpha$ is equal to $\frac{1}{2}$; thereafter the diagram of FIG. 3 showing the result of the multiplication of an integer N by $\alpha = \frac{1}{2}$ with subsequent roundoff will be discussed. In this Figure the first column shows a sequence of some integers N which are near to zero and the second column the result of the multiplication of these numbers by $\frac{1}{2}$ with roundoff, the arrows indicating agreement between the numbers of the two columns. It is clear that for the even numbers N the multiplication by $\alpha = \frac{1}{2}$ is exact. For the odd numbers N the result of the multiplication by $\frac{1}{2}$ with roundoff amounts to a multiplication by a coefficient differing from $\frac{1}{2}$ and smaller than 1, N=1 excepted, for which this coefficient has the value 1.

At any instant nT the outputs $y_n$ and $y'_n$ of the two filters 10, 10' may be written:

$$y_n = x_n + \alpha_n y_{n-1}$$

$$y'_n = x_n + \alpha'_n y'_{n-1}$$

In these formulae $\alpha_n$ and $\alpha'_n$ are coefficients in which the roundoff effected after the multiplication of $\frac{1}{2}$ of the content $y_{n-1}$ and $y'_{n-1}$ of the two registers 12, 12' have been taken into consideration. Consequently we may write:

$$\alpha_n y_{n-1} = \frac{1}{2} y_{n-1} + \Delta$$

$$\alpha'_n y'_{n-1} = \frac{1}{2} y'_{n-1} + \Delta'$$

$\Delta$ and $\Delta'$ being terms which may assume the values 0 or $\frac{1}{2}$.

From this it can be derived that:

$$y_n - y'_n = \frac{1}{2}[y_{n-1} - y'_{n-1}] + [\Delta - \Delta'] \qquad (1)$$

In this last expression (1), $[\Delta - \Delta']$ may assume the values $-\frac{1}{2}$, 0 or $\frac{1}{2}$.

It will be apparent that when the contents $y_{n-1}$ and $y'_{n-1}$ of the two registers 12, 12' are:

$$|y_{n-1} - y'_{n-1}| > 1,$$

we obtain:

$$|y_n - y'_n| < |y_{n-1} - y'_{n-1}|,$$

indicating that the output values $y_n$ and $y'_n$ of the two filters at instant nT approach each other.

When $|y_{n-1} - y'_{n-1}| = 1$, the deviation between the output values of the two filters at the instant nT may remain constant or be cancelled.

In the case where $y_{n-1} - y'_{n-1} = 1$ it is easy to see on the basis of FIG. 3 that when $y_{n-1}$ is an even number, $y_n - y'_n = 0$, and when $y_{n-1}$ is an odd number $y_n - y'_n = 1$. The opposite situation is obtained when $y_{n-1} - y'_{n-1} = -1$.

Finally, when a multiplying factor $\alpha$ equal to $\frac{1}{2}$ is used in the two first-order purely recursive filters, which initially have different contents in their storage registers, the deviation between the output values of these two filters decreases considerably until it becomes equal to 1. Thereafter one value out of two values of the content of one register or of the other enables the cancellation of this deviation, that is to say to obtain convergence of the two filters. As the content of the two registers is a function of the numbers $x_n$ applied jointly to the input of the two filters we may say that when the deviation between their outputs is equal to 1, one value out of two values of these input numbers enable thereafter the obtention of the final convergence. When the signal constituted by the input numbers is aleatory, the possibility that the deviation remains 1 tends to zero versus the time. For this reason filters having this property are denoted statistically convergent filters.

In the most general case, where a multiplying factor $\alpha$ of the form $1-(c/d)$ is used for these two first-order filters, the deviation between the output values of the two filters decreases until it has been become equal to d, in a finite number of elementary periods T, this number being smaller in proportion as c/d is closer to 1. Then, c values out of d values of the numbers applied to the input of the two filters contribute to their final convergence. For an aleatory input signal the probability to keep a deviation different from 0 tends to zero versus the time.

Generally, purely recursive filters of an order higher than 1 do not come up to the statistical convergence property. This property is nevertheless obtained for some of these filters.

A first type of purely recursive filters of any order and coming up to the statistical convergence property is obtained by cascading first order filter sections having the transfer function to Z defined above, having a coefficient less than 1. For example, a second-order filter of this type has the transfer function:

$$\frac{1}{(1 - Z^{-1}\alpha_1)(1 - Z^{-1}\alpha_2)}$$

wherein $\alpha_1$ and $\alpha_2$ are the coefficients of the two cascaded first-order sections, respectively.

Another type of purely recursive filter of any m order and coming up to the statistical convergence property is a filter having a sole coefficient differing from zero and whose transfer function to Z may be written as: $1/[1-Z^{-m}\beta]$, wherein $\beta$ is the coefficient of the filter.

Figure 4:
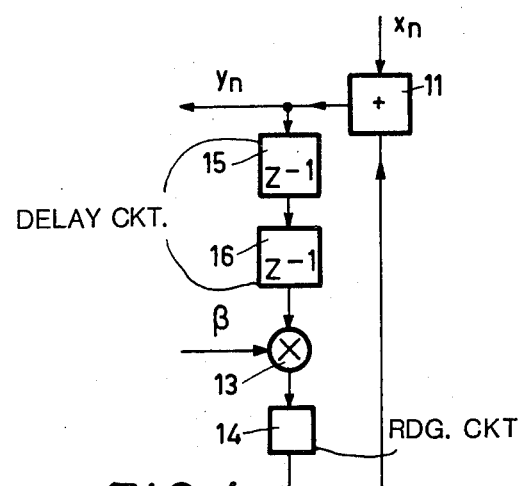
FIG. 4 shows schematically a purely second-order recursive filter having one sole coefficient differing from zero.

A second-order filter of this type has, for example, the transfer function to Z: $1/[1-Z^{-2}\beta]$. With a negative coefficient $\beta$ and an absolute value below 1, this filter comprises two poles which are represented in the plane of Z by two conjugated pure imaginary values. The circuit diagram of such a second-order filter is shown in FIG. 4. This filter comprises certain elements which are identical to the filter 10 of FIG. 2 and have been given the same reference numerals. However, the output of the adder circuit 11 is connected to an input of the multiplier 13, which multiplies by $\beta$ by means of two delay circuits 15 and 16, connected in cascade, and each producing the delay T (function $Z^{-1}$ for each circuit). The second-order filter of FIG. 4 satisfies the statistic convergence property as it may be considered as an assembly of two first-order filters over which the samples $x_n$ of the input signal having the frequency $1/T$ are distributed, each of these filters operating at half the freqency $1/2T$.

Filters of this type of any m order are of the construction shown in FIG. 4, each having m delay circuits, instead of two, in their loops.

Finally, and filter which may be in the form of a cascade arrangement of first-order filter sections and/or filter sections of any order higher than 1 and having one sole coefficient differing from zero is statistically convergent, on the condition, however, that the roundoff operations are effected separately in each of the filter sections of which this filter is comprised.

According to the invention, in the differential PCM transmission system shown in FIG. 1 the remote decoder 4 and the local decoder 6 can be realized by means of a purely recursive filter of the statistic convergence type just described. Assuming, for example, that this filter is formed by a cascade arrangement of first-order and second-order filtering sections, the function $1/G(z)$ of these decoders may be written:

$$\frac{1}{G(z)} = \pi_{i=o}^p \frac{1}{[1 - \alpha_i Z^{-1}]} \cdot \pi_{j=o}^r \frac{1}{[1 - \beta_j Z^{-2}]} \quad (2)$$

In this formula (2), $\alpha_i$ and $\beta_j$ are the coefficients of the p first-order sections and the r second-order sections, respectively, of which the filter is comprised.

An embodiment of the decoder using such a filter is shown in FIG. 5. This embodiment relates more particularly to the remote decoder 4 for it will be seen that when using special outputs for the local decoder constructed thus the overall function of the prediction filter 3 of the encoder can be realized in a very simple way, namely $[1-G(z)]\,1/G(Z)$.

The decoder of FIG. 5 comprises, between its input 17 and its output 18, a cascade arrangement of first-order recursive sections $F_{10}\ldots F_{1p}$, having the coefficients $\alpha_o\ldots \alpha_p$, respectively, in series with a cascade arrangement of second-order recursive sections $F_{20}\ldots F_{2r}$, each having a sole coefficient, differing from zero $\beta_o\ldots \beta_r$, respectively. Each first-order section such as $F_{10}$ comprises the same elements, which have been given the same reference numerals as filter 10 in FIG. 2; each second-order section such as $F_{20}$ comprises the same elements, which have been given the same reference numerals as the filter in FIG. 4. This decoder receives the differential PCM-coded signal X and produces the linear PCM-coded signal Y'.

In order to realize an encoder which corresponds to the decoder of FIG. 5 and, consequently has the transfer function $G(z)$, the function $$\frac{1}{G(z)}[1 - G(z)]$$

of the prediction filter 3 (see FIG. 1) must be realized. To explain how this function is realized in accordance with the invention, the output signals of the first-order sections $F_{10}\ldots F_{1p}$ are denoted $W_o\ldots W_p$, respectively and the output signals of the second-order sections $F_{20}\ldots F_{2r}$ are denoted $V_o\ldots V_r$, respectively, as shown in FIG. 5.

It can be demonstrated that when these signals are used, the product $$X \cdot \frac{1}{G(z)}[1 - G(z)],$$

which defines the prediction signal may have the form:

$$X \cdot \frac{1}{G(z)}[1 - G(z)] =$$

$$\alpha_o W_o^{n-1} + \ldots + \alpha_p W_p^{n-1} + \beta_o V_o^{n-2} + \ldots \beta_r V_r^{n-2}$$

In this formula the terms $W_o^{n-1}$ to $W_p^{n-1}$ are the output values of the first-order sections $F_{10}$ to $F_{1p}$ at the instant $(n-1)T$ and the terms $V_o^{n-2}$ to $V_r^{n-2}$ are the output values of the second-order sections $F_{20}$ to $F_{2r}$ at the instant $(n-2)T$. It will be apparent that in a decoder such as shown in FIG. 5 the products of the above-mentioned formulae are available at the output of the multiplying circuits 13 and, after roundoff, at the output of the roundoff circuit 14; so, by forming the sum of these products at each instant nT the prediction signal is obtained at this instant nT.

FIG. 6 shows the circuit diagram of an encoder 1 to be associated with the remote decoder 4. This encoder comprises an input 19 connected to the input (+) of the difference circuit 2 and an output 20 connected to the output of the difference circuit 2 furnishing the differential PCM signal X. This signal X is applied to the prediction filter 3, which comprises the same cascade arrangement of first-order filters $F_{10}$ to $F_{1p}$ and second-order filters $F_{20}$ to $F_{2r}$ having a sole coefficient differing from zero, as the remote decoder 4 of FIG. 5. Each one of these first-order and second-order sections comprise in the same manner its own roundoff device 14. The total function of the prediction filter 3, $$\frac{1}{G(z)} [1 - G(z)]$$

is realized by forming, by means of the adder circuit 21, the sum of the signals rounded by the circuits 14. The prediction signal, which is applied to the input (−) of the difference circuit 2 is obtained at the output of the adder circuit 21.

It will now be demonstrated that in a transmission system using the encoder and the remote decoder of the FIGS. 6 and 5, the distant decoder can furnish at its output 18 exactly the same signal as that applied to the input 19 of the encoder, while effecting in each filter section $F_{10}$ to $F_{2r}$ of the encoder and the decoder the same rounding operation with a step size equal to the quantizing step of the transmitted differential PCM signal X and by also effecting, if necessary, an identical rounding operation on the linear PCM signal to be coded.

The quantizing step of the transmitted differential PCM signal may either be constant or variable in a syllabic compression system to be described hereinafter. In both cases it is possible to effect the required rounding operations in the same manner in the encoder and the decoder. In the filter sections $F_{10}$ to $F_{2r}$ of the coder and the decoder the rounding operation is effected, as described above, by means of the rounding circuit 14. In addition, FIG. 6 shows a rounding circuit 22 which receives the linear PCM signal Y to be coded, and which is assumedly non-rounded, this rounding circuit 22 producing the signal Y' which is the result of the roundoff of the signal Y with a step equal to the quantizing step of the differential PCM signal X.

In the transmission system utilizing the encoder and the decoder of the FIGS. 6 and 5, the differential PCM signal X is simultaneously applied to the cascade arrangement of the filter sections $F_{10}$ to $F_{2r}$ of the encoder and the decoder. As these sections are of the statistic convergence type and since roundoff is effected in the same manner with a step equal to the quantizing step of the differential PCM signal X, the sections of the encoder and the sections of the decoder will produce, after convergence, the same signals. The result is that in the encoder the prediction circuit produces, after convergence, a prediction signal Y' which is rounded in the same manner. The transfer function of this prediction filter being $$\frac{\hat{Y}}{X} = \frac{1}{G'(Z)} [1 - G'(z)].$$

As the signal Y', applied to the input 19 of the encoder, also consists of integers (because of the roundoff operation performed by the circuit 22) the difference circuit 2 produces the error signal Y'−Y', which also consists of integers and which constitutes the differential PCM signal X, the transfer function of the encoder being $$\frac{X}{Y} = G'(z).$$

The remote decoder of FIG. 5 which receives the same signal X as applied to the prediction filter, has the transfer function $1/G'(z)$ and produces therefore at its output 18 the same signal Y', which was rounded with a step equal to the step of the differential PCM signal applied to the input 19 of the encoder.

When a plurality of encoders 1 and decoders 4 as shown in FIGS. 6 and 5 are arranged in cascade and when a signal Y', rounded with a step equal to the quantizing step of the transmitted differential PCM signal is applied to the first encoder, all the encoders will be aligned, that is to say they will furnish the same differential PCM signal X and all the decoders will be aligned, that is to say they will produce the same rounded-off linear PCM signal Y', the probability of complete alignment tending to 1 versus the time. Actually, the encoders have the transfer function $1/G'(z)$ of the recursive filters of the statistic convergence type and the decoders have the transfer function $G'(z)$ of non-recursive filters having an absolute convergence. It should be noted that in such a cascade arrangement of encoders and decoders, no other degradation of the signal is introduced than that produced by the first encoder and resulting in particular from the roundoff effected at the input of the first encoder by the circuit 22 and the roundoff effected in the filter sections by the rounding circuits 14.

In the transmission system according to the invention considered so far, the remote decoder and the local decoder included in the encoder are purely recursive filters corresponding to the transfer function $1/G(z)$ defined by the formula (2).

In accordance with a further embodiment according to the invention, the local decoder and the remote decoder may each consist of a filter comprising the cascade arrangement of a purely recursive portion of the statistic convergence type, having a transfer function $1/G(z)$, and a non-recursive portion, having a transfer function $H(z)$. For reasons which will be explained hereafter, the non-recursive portion must be of a similar construction as assigned to the purely recursive portion, that is to say, it must be comprised of a cascade arrangement of first order non-recursive sections and/or non-recursive sections of an order higher than unity, having a sole coefficient different from zero, each section being provided with its own rounding device. This filter comprises simultaneously poles and zeros. It being assumed that it only comprises first-order and second-order sections, its transfer function $H(z)/G(z)$ may express itself as a product comprising, as indicated by the following formula (3), a portion which is identical to the formula (2) to represent the function $1/G(z)$, and a portion for representing the function $H(z)$.

$$\frac{H(z)}{G(z)} = \pi_{i=o}^{p} \frac{1}{1 - \alpha_i Z^{-1}} \cdot \pi_{j=o}^{r} \frac{1}{1 - \beta_j Z^{-2}} \cdot \quad (3)$$

$$\pi_{k=o}^{s} (1 - a_k Z^{-1}) \cdot \pi_{l=o}^{w} (1 - b_k Z^{-2})$$

FIG. 7 shows the circuit diagram of a remote decoder 4 having the transfer function $H(z)/G(z)$ of formula (3). This circuit diagram contains a certain number of elements which are identical to those of the circuit diagram of FIG. 5, which have been given the same reference numerals. The purely recursive portion having the function $1/(Gz)$ is represented by the sections $F_{10} \ldots F_{2r}$ which are of the same construction as in FIG. 5. In series with this purely recursive portion there is the non-recursive portion having the transfer function $H(z)$ and being comprised of s first-order sections of which only the first one, $F'_{10}$, is shown, and of w second-order sections having a sole coefficient different from zero, of which only the last second-order section F'$_{2w}$ is shown. The non-recursive first-order sections as, for example, F'$_{10}$, are comprised of the same elements as the recursive sections such as, for example, F$_{10}$, these elements having been given the same reference numerals provided with an accent notation. But the series arrangement of the delay circuit 12', the multiplier circuit 13' and the roundoff circuit 14' is connected between the two inputs of the adder circuit 11' instead of between the output and the input of this adder. This also applies to a non-recursive second-order section as, for example, F'$_{2w}$, relative to a recursive second-order section as, for example, F$_{2r}$.

An encoder 1 which corresponds to the remote decoder 4 of FIG. 7, can be realized in accordance with the circuit diagram of FIG. 8. This circuit diagram shows a certain number of elements which are identical to those of the encoder shown in FIG. 6 and which have been given the same reference numerals. A local decoder which is identical to the remote decoder and consists of the cascade arrangement of the sections F$_{10}$ ... F$_{2r}$, F'$_{10}$ ... F'$_{2w}$ is used in the prediction filter 3. The prediction filter 3 is obtained by forming, by means of the adder circuit 21, the sum of the signals obtained at the output of the different roundoff circuits 14 and 14'. The prediction filter realizes the transfer function $$\frac{H(z)}{G(z)}\left[1 - \frac{G(z)}{H(z)}\right].$$

A transmission system using the cascade arrangement of encoders and decoders as shown in FIGS. 7 and 8 has the same characteristics as the characteristics indicated hereabove for a system using the encoders and decoders of FIGS. 5 and 6. Actually, the decoder having the transfer function H(z)/G(z) uses only filter sections of the statistic convergence type or of the absolute convergence type. The encoder has the transfer function G(z)/H(z) wherein the purely recursive portion 1/H(z) corresponds to a cascasde arrangement of purely recursive sections of the statistic convergence type, on account of the chosen function H(z). Finally, the same differential PCM signal X is obtained, without any exception, at the output of each encoder and the same rounded linear PCM signal Y' at the output of each decoder by applying to a cascade arrangement of such encoders and decoders a signal Y' which is rounded with a step equal to the quantizing step of the differential PCM signal X and by effecting the same rounding operation in the circuits 14, 14' of each section. Only the first conversion in this cascade arrangement produces a degradation of the signal.

One might remark that if it is absolutely necessary to effect the rounding operation in the encoders by means of the circuits 14 and 14', which follow immediately after the multipliers 13 and 13', to obtain a rounded prediction signal Ŷ', one could equally well perform, in the decoders, the rounding operations at the output of the adder circuits 11 and 11'. All the details mentioned here above also hold if truncations are performed instead of rounding to limit the number of bits, the essential fact being that the bit number limiting operations must be performed in the positions and the manner indicated.

In a digital communication network operating on the principle of differential PCM tramsmission as described above, and prior to the transmission of telephone signals and data signals, the filter which acts as the remote decoder and the local decoder included in the encoder must be a low-pass filter which must transmit the speech signals as well as the data signals in the best possible manner. It is a known fact that in telephony the spectra of the speech signals are present at the low-frequency side, with an amplitude which, beyond 800 Hz decreases with a rate around 9 dB per octave. The spectrum of the data signals has its maximum at the frequency of 1800 Hz of the carrier. It was found that a satisfactory compromise between the speech signals and the data signals is obtained when a filter having the transfer function:

$$\frac{H(z)}{G(z)} = \frac{(1 + \frac{1}{2} Z^{-1})}{(1 - \frac{1}{2} Z^{-1})^2(1 + \frac{1}{2} Z^{-2})}$$

is used as the decoders.

This compromise filter is assembled from filter sections which satisfy the above-mentioned criteria and have the advantage that they only use very simple coefficients $\pm\frac{1}{2}$.

So far it has been assumed that in transmission systems according to the invention a linear PCM signal (that is to say a signal consisting of numbers obtained by linear coding of the samples) is applied to the encoder. It is known that in the digital transmission networks which are normalized by the CEPT the samples of the PCM signals are transmitted after having been subjected to an instantaneous compression which cause the 12-bit linearly coded samples to change into coded samples which have been compressed to 8 bits. The result is that when one wants to use the differential PCM transmission system described above in a digital network, each coding circuit must be preceded by an expansion circuit which converts the PCM signals which were compressed to 8 bits into 12-bit linear PCM signals, whereas each decoder must be followed by a compression circuit for compressing the signals again.

The consequences thereof and the measures to be taken in the system according to the invention will now be investigated.

FIG. 9 shows a cascade arrangement using the encoders and decoders of the invention and comprising the necessary compression and expansion circuits for processing the numbers of a compressed PCM signal. The symbols of the signals occurring in different points of the circuit during a first transmission are indicated on the line Y in the circuit diagram of FIG. 9.

For a first transmission, the PCM signal Z which was compressed to 8 bits is applied to a known expansion circuit 30, which produces a 12-bit linear PCM signal Y. This signal is applied to a rounding circuit 31, which performs a rounding operation with a step equal to the differential PCM, that is to say a rounding operation with a step equal to the quantizing step of the differential PCM signal X. This circuit 31 has the same function as the rounding circuit 22 in the FIGS. 6 and 8 and produces a rounded linear PCM signal Y'. It is not possible to specify the number of bits, differing from zero, of the signal Y' as this number of bits depends on the step size of the differential PCM used for rounding. In the differential PCM system described hereafter, this step size is variable. The signal Y' is applied to an encoder 32, which produces a differential PCM signal X, which is transmitted to a decoder 34 via a transmission means 33. It was explained above that, by using an encoder 32 and a decoder 34 according to the invention, the same rounded signal Y' is obtained at the output of the decoder 34 as the signal which is applied to the encoder 32 and which differs from the original linear PCM signal Y. When a PCM signal compressed to 8 bits is wanted again, for example to perform a switching action in a time-switching exchange 36, a compression circuit 35 must be used whose operation is opposite to that of the expansion circuit 30 and which produces a signal Z', compressed to 8 bits, this signal generally differing from the original, compressed signal Z.

Should one want to effect a new transmission in differential PCM on the basis of the signal Z' coming from the exchange 36, the above-described operations must be repeated by means of identical circuits. For simplicity, FIG. 9 shows that, for this new transmission, the signal Z' (shown on the line II) is applied to the input of the expansion circuit 30, which produces a signal Y'', which may differ from the original signal Y used for the first transmission. This signal Y'' produces at the output of the rounding circuit 31 a signal Y'*, which may also differ from the signal Y' used for the first transmission. Consequently, there is a risk that errors accumulate in each transmission.

It will now be demonstrated that when rounding is performed with the step size of the differential PCM on the numbers of the opposite sign, changing the sign of the numbers of the signal Y having been done previously, in the rounding circuit 31, whereafter the initial sign of the numbers thus rounded has been restored, the same rounded signal Y' is always obtained at the output of this circuit 31. In other words, using the above notations, processing the signal Y' in the cascade arrangement of the compression circuit 35, the expansion circuit 30 and the rounding circuit 31 must produce a signal Y'*=Y'. This special rounding operation, called, for simplicity, hereinafter "rounding with sign change" has for its object to inverse the role of the bounding points of the half-open interval defining the numbers furnishing the same roundoff.

Consequently, by using in the circuit 31 a rounding with sign change with the step size $\Delta$ of the differential PCM signal, the rounded numbers Y', which are a multiple of $\Delta$ (Y'=k$\Delta$) and are associated with the half-open interval such as:

$$Y \in \left[ Y' - \frac{\Delta}{2}, Y' + \frac{\Delta}{2} \right[ \quad (4)$$

are obtained.

In all other respects, the compression-expansion operation of the numbers of the signal Y' in the circuits 35 and 30 is identical to a "normal" roundoff with a step size $\Delta'$, depending on the amplitude of the number, resulting in the numbers Y'', which are a multiple of $\Delta'$ (Y''=k'$\Delta'$) and are associated with the half-open interval such as:

$$Y' \in \left] Y'' - \frac{\Delta'}{2}, Y'' + \frac{\Delta'}{2} \right] \quad (5)$$

Finally, the rounding operation with sign change in circuit 31 on the numbers Y'' may be written as:

$$Y'^* \in \left[ Y'' - \frac{\Delta}{2}, Y'' + \frac{\Delta}{2} \right[ \quad (6)$$

From the formulae (4), (5), (6) it will be clear that the side where the intervals are open depends on the corresponding type of roundoff, namely roundoff with sign change or normal roundoff.

In view of the fact that the step size $\Delta$ of the differential PCM signal may be variable, which also applies to the step $\Delta'$ of the roundoff operation to which the compression-expansion is equivalent, all the possible cases for the value of $\Delta$ relative to those of $\Delta'$ must be taken into consideration.

The first case is where $\Delta'/2 < \Delta/2$. By combining the formulae (5) and (6) it is possible to write that:

$$Y'^* \in \left] Y' - \frac{\Delta'}{2} - \frac{\Delta}{2}, Y' + \frac{\Delta'}{2} + \frac{\Delta}{2} \right[$$

As $\frac{\Delta'}{2} < \frac{\Delta}{2}$ it can be derived therefrom that:

$$Y'^* \in \left] Y' - \Delta, Y' + \Delta \right[$$

As Y'*=k$\Delta$, it is obtained that Y'*=Y', which is the desired result.

The other case which will now be considered is where $\Delta'/2 \geq \Delta/2$. By combining the formulae (4) and (5) it is possible to write that:

$$Y'' \in \left] Y - \frac{\Delta}{2} - \frac{\Delta'}{2}, Y + \frac{\Delta}{2} + \frac{\Delta'}{2} \right[$$

If $\frac{\Delta'}{2} > \frac{\Delta}{2}$ and, in the worst case, if $\Delta'/2 = \Delta/2$ it can be written that:

$$Y'' \in \left] Y - \Delta', Y + \Delta' \right[$$

As Y''=k'$\Delta$, it can be derived therefrom that Y''=Y and it will be clear that the desired result is obtained at the output of the rounding circuit 31, namely Y'*=Y'.

It is therefore possible, in all cases, by effecting a roundoff with sign change in the circuit 31, to arrange the encoding and decoding circuits of the invention described so far and associated with the expansion and compression circuits of the PCM signal, in cascade.

With reference to the circuit diagrams of the encoders according to the invention, shown in FIGS. 6 and 8 it has been assumed so far that the only non-linear operations performed to encode a linear PCM signal Y into a differential PCM signal X, were roundoff operations: roundoff with sign change of the signal Y to obtain the rounded signal Y' and a normal roundoff operation performed in the various filtering sections of the prediction filter to obtain the rounded prediction signal Ŷ'. These rounding operations are performed with a step which is equal to the quantizing step of the differential PCM signal and at the output of the difference circuit 2 a difference signal E is obtained, which was rounded with the same step. So far the differential PCM signal X produced by the encoder has been identified with the difference signal E. Now we want to transmit a differential PCM signal X, which has only a limited number of bits, for example 4 bits, whereas the difference signal E has more than four bits of a varying value, the least significant bit of a variable value having a weight which is equal to the quantizing step of the differential PCM signal.

The concise circuit diagram of the encoder shown in FIG. 10, which comprises the same elements as in the FIGS. 6 and 8 which have been given the same reference numerals, shows that there must therefore be provided at the output of the difference circuit 2 a non-linear circuit with saturation overflow 40 which, within a certain range, quantizes the difference signal E in accordance with a predetermined law for forming the differential PCM signal X comprising 4 variable bits, and which, outside that range, saturates the signal E to form a positive or negative signal X of the same value, whatever the signal E may be.

FIG. 11, for example, shows the response X as a function of E for a non-linear circuit with saturation overflow having a linear quantizing law. The 4-bit signal X, which is assumed to be expressed in a two's complement code may take 16 discrete values ranging from $-8$ to $+7$. Quantizing is done with the same step size $\Delta = q$ for the values of E located in the range from $-8q$ to $+7q$; in this range the response X as a function of E is represented by a staircase curve which is situated on both sides of a segment S, which has a slope $(1/\Delta) = (1/q)$. Outside this range, the difference signal E is saturated and the value of the signal X remains equal to $+7$ for positive values of the signal E, and equal to $-8$ for the negative values of the signal E.

It is equally possible to use a non-linear quantizing law, for example the law illustrated by way of example in FIG. 12. It will be seen that in this Figure, which represents the response X as a function of E at the same scale as in FIG. 11, quantization is performed with the step size $\Delta = q$ for values of E located in the range from $-5q$ to $+4q$. In this range, the response X as a function of E is represented by a staircase curve around the segment $S_1$, which has a slope $(1/\Delta) = (1/q)$. In two ranges of the signal E, from $+4q$ to $+10q$ and from $-5q$ to $-11q$, quantization is performed with the step size $\Delta = 2q$; in these two ranges the response X as a function of E is represented by two staircase curve portions around the two segments $S_2$, $S'_2$, which have a slope of $(1/\Delta) = (1/2q)$. Outside the range from $-11q$ to $+10q$ the difference signal E is saturated and the value of X remains equal to $+7$ or to $-8$. A comparison of the FIGS. 11 and 12 shows clearly that the use of a non-linear quantization allows an extension of the range of the values of the signal E which are quantized without saturation. A non-linear quantization may of course be performed in accordance with a law which is more complicated than the law of FIG. 12 and uses more than two quantizing steps.

Now we will go into the problem which the above-described saturation causes in a system formed by a cascade arrangement of encoders and decoders, which are associated with the compression and expansion circuits shown in FIG. 9. Let it be assumed that in this Figure the encoder 31 comprises a non-linear circuit with saturation overflow which has a linear quantizing law of the type described for FIG. 11. First of all, it is obvious that as long as no saturation of the difference signal E occurs in this encoder 32, the operation of the cascade arrangement of FIG. 9 is exactly the same as described above, by means of the signals whose symbols are shown at lines I and II.

Line III of FIG. 9 shows the various signals which appear at different points of the diagram during a first transmission, when an encoder 32 is used in which the difference signal E is saturated. The same signals as those shown at line I, namely Z, Y, Y', respectively, appear at the inputs of the expansion circuit 30, the roundoff circuit with sign change 31 and the encoder 32. In contrast therewith there appears at the output of the encoder 32 in which it is assumed that the difference signal E is present in the saturated state, a signal $X_1$ which differs from the signal E of the line I and, after having been transmitted along the line 33, this signal $X_1$ produces the signals $Y'Hd 1$ and $Z'_1$, which differ from the corresponding signals Y' and Z' of line I, at the outputs of the decoder 34 and of the compression circuit 35. When, with a view to a new differential PCM transmission, one wants to perform a new coding, the signals shown at line IV, that is to say $Z'_1$, $Y''_1$ and $Y'_1*$, respectively, are obtained at the inputs of an expansion circuit, such as 30, a roundoff circuit, such as 31 and at the input of an encoder, such as 32.

The intervals with which the signals Y', Y'' and $Y'_1*$ are associated can be defined by means of the three relations (4a), (5a), (6a), which are similar to the above relations (4), (5), (6):

$$Y \epsilon \left[ Y - \frac{\Delta}{2}, Y + \frac{\Delta}{2} \right[ \text{ wherein } Y = k\Delta \tag{4a}$$

$$Y''_1 \epsilon \left] Y_1 - \frac{\Delta'}{2}, Y_1 + \frac{\Delta'}{2} \right] \text{ wherein } Y''_1 = k'\Delta' \tag{5a}$$

$$Y'_1* \epsilon \left[ Y''_1 - \frac{\Delta}{2}, Y''_1 + \frac{\Delta}{2} \right[ \text{ wherein } Y'_1* = k\Delta \tag{6a}$$

$\Delta$ and $\Delta'$ have the same meaning as mentioned above.

If $\Delta'/2 < \Delta/2$, by combining the formulae (5a) and (6a), it will be easy to demonstrate that $Y'_1* = Y'_1$. In the encoder 32 to which, for a new transmission, the signal $Y'_1$ is applied, no further saturation of the difference signal E will be caused and, consequently, this signal $Y'_1$ will be obtained at the output of the remote decoder 34. This shows that, if $\Delta'/2 < \Delta/2$ it is possible to realize a cascade arrangement of encoders, having a saturation function and decoders, with associated compression circuits and expansion circuits without any other degradation of the signal (particularly by saturation) than the degradation produced in the first encoder.

If $\Delta'/2 \geq \Delta/2$, it is not possible to combine the relations (4a) and (5a) as was done for the corresponding relations (4) and (5) and, when the difference signal E is saturated in the encoder 32, the signal $Y''_1$ at the input of the roundoff circuit 31 for a new transmission differs from the corresponding signal Y for the first transmission. It is therefore possible that a degradation of the signal is produced by saturation during each coding.

To obviate this drawback it is possible to replace the encoder of FIG. 10 by the encoder whose circuit diagram is shown in FIG. 13. The input signal 19 of this encoder 1 is the linear PCM signal Y' formed by round-off with sign change. The encoder comprises a difference circuit 50 one input of which receives the signal Y' and the other input the prediction signal $\hat{Y}'$ coming from the prediction filter 3, which is identical to the filter of the encoders shown in FIGS. 6 and 8. The signal at the output of the difference circuit 50 is applied to the non-linear circuit with saturation overflow 51 which supplies the signal denoted $x_1$ when saturation is performed. The adder circuit 52 to which the saturated difference signal $x_1$ and the prediction $\hat{Y}'$ is applied produces a reconstituted signal $y'_1$, which differs from the signal Y', particularly as the result of the saturation.

This signal $y'_1$ is applied to the series arrangement of the compression circuit 53 and the expansion circuit 54, which perform the same operations as the corresponding circuits 35 and 30 in the cascade arrangement of FIG. 9. The signal $y''_1$ at the output of the expansion circuit is defined by the following relation (5b), which is analogous to (5a):

$$y''_1 \epsilon \left] y'_1 - \frac{\Delta'}{2}, y'_1 + \frac{\Delta'}{2} \right] \tag{5b}$$

wherein $\Delta'$ is the roundoff step corresponding to the compression-expansion operation performed in the circuit 53, 54.

The signal $y''_1$ is applied to the circuit 55 which performs a roundoff with sign change with the step size $\Delta$ of the differential PCM signal and produces a signal $y'^*_1$. In the case under consideration, where $\Delta'/2 \geq \Delta/2$ this signal $y'^*_1$ may have a value which differs from $y'_1$. The signal $y'^*_1$ is applied to a coding circuit with saturation, comprising the difference circuit 56, one input of which receives the signal $y'^*_1$, the other input receiving the prediction signal $\hat{y}'$ and the output of which supplies the difference signal x'. The difference signal x' is applied to the non-linear circuit with saturation overflow 57, which is identical to circuit 51 and which produces the signal x' which constitutes the differential PCM signal at the output of the encoder, last-mentioned signal being also applied to the prediction filter 3 of the encoder.

If the difference signal x' is saturated by the non-linear circuit with saturation overflow 57, the output signal X' of this last-mentioned circuit will be equal to the signal $x_1$ produced by the non-linear circuit with saturation overflow 51. From this it follows that if the signal $X' = x_1$ is applied from the output of the encoder to a remote decoder (for example 34 in FIG. 9) followed by a compression circuit (for example 35) and an expansion circuit (for example 30), the signal $Y''_1 = Y'''_1$ will be found at the output of this expansion circuit. By repeating, in a cascade arrangement, the same coding and decoding operations with expansion and compression, the same signal $y''_1$ will always be found at the output of the expansion circuit.

When the difference signal x' is not saturated by the non-linear circuit with saturation overflow 57, the signal X' at the output of the encoder is such that X' = x', that is to say this is the same as when the value of the signal Y' to be encoded would have been altered for the first coding by replacing it by a quantity equal to $y'^*_1$, so that the remote decoder will be able to restitute it accurately and which, applied to another encoder, enables the obtention of the same value x' for the differential PCM signal.

So operations which are similar to the cascading of two consecutive transcoders are performed locally, and only the value which enables the alignment of these two transcoders are retained for transmission in differential PCM.

Thus, the use of the encoder of FIG. 13 enables, irrespective of the respective values of roundoff step $\Delta$ and $\Delta'$, the arrangement in cascade of encoders and decoders with associated expansion and compression circuits, without any degradation of the signal except the degradation produced by the first coding. However, in the majority of practical applications, the spectra of the signals are such that they will very rarely be in the situation where $\Delta'/2 \geq \Delta/2$, so that it is often sufficient to use the more concise circuit diagram of the encoder of FIG. 10 without noticeable degradation of the signal in the consecutive codings.

So far the transmission system according to the invention has been described, on the assumption that quantizing the difference signal E was performed with a quantizing step having a fixed value. However, the error signal E depends on the level variations of the PCM signal to be encoded and to prevent the signal to be transmitted from being degradated to an impermissible extent, it is necessary to match the size of the quantizing step automatically to the value of signal E, this matching operation usually being done for speech signals with a time constant in the order of the duration of one syllable.

FIG. 14 shows the general structure of a differential PCM encoder having a variable quantizing step, whereas FIG. 13 shows the general structure of the associated remote decoder.

The encoder of FIG. 14 comprises a certain number of elements which have already been shown in the preceding Figures (for example FIG. 10) and have been given the same reference numerals. To quantize the error signal E with a variable quantizing step $\Delta$, a variable quantizer 60 is used which is connected to the output of difference circuit 2 and which must produce the differential PCM signal X, which must be transmitted with 4 bits. This variable quantizer 60 comprises a compressor 61 in the form of a dividing circuit and a non-linear circuit with saturation overflow 63. The divider circuit 61 divides the numbers of the error signal E by the numbers of the signal Q, which represents the size q of the variable quantizing step, this signal Q being available at the output 65 of the compression network 64 which determines the size of the quantizing step starting from the output signal X of the encoder. The non-linear circuit with saturation overflow 63, connected to the output of the divider circuit 61, also receives the signal Q, which represents the size q of the variable step and which operates thus that the overall response X of the quantizer 60 to the difference signal E is of the type shown in FIG. 11 with a linear quantizing law, or of the type shown in FIG. 12 with a non-linear quantizing law.

Let is now be assumed that in a first stage of the description of a system having a variable quantizing step size a quantizer 60 having a linear quantizing law is used. The detailed operation of this quantizer will be explained with reference to the following Table I.

TABLE I

| | $2^{11}$ | $2^{10}$ | $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|---|---|---|
| Y | x | x | x | x | x | x | x | x | x | x | x | x |
| E | S | x | x | x | x | x | x | x | O | O | O | O |
| $\frac{E}{Q}$ | S | S | S | S | S | x | x | x | x | x | x | x |

TABLE I-continued

| | $2^{11}$ | $2^{10}$ | $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|---|---|---|
| X | | | | | | | | | S | x | x | x |
| XQ | S | S | S | S | S | x | x | x | 0 | 0 | 0 | 0 |

The second line of this table shows by means of crosses the 12 bits of a variable value of the linear PCM signal $\hat{Y}$, which is applied to the roundoff circuit 22, the significance of these bits, ranging from $2^{11}$ to $2^0$, being indicated on the first line. In what was described herebefore it was shown that the signals Y' and Y', applied to the inputs of the difference circuit 2 were the result of the roundoff performed with a step which was equal to the quantizing step of the differential PCM. Assuming this step to be equal to a power of 2, for example $2^4$, the rounded signals Y' and Y' and, consequently, the error signal E always contain 4 bits of the value zero, having weights arranging from $2^3$ to $2^0$. The error signal E having this structure is shown in the third line of Table I, wherein S represents its sign bit. The divider circuit 61, which divides the error signal E by the signal Q which represents the size of the quantizing step, supplies the signal quotient E/Q, which in the example chosen here wherein this step amounts to $2^4$ is obtained in a simple manner by shifting the 4-bit signal E to the right, as shown by the fourth line of Table I. When the signal quotient E/Q comprises, inclusive of the sign bit, more than 4 bits of a variable value (which is the case in the present example), the non-linear circuit with saturation overflow 63 produces a 4-bit signal X which corresponds to the maximum value of a signal representable with 4 bits. If the signal quotient E/Q comprises 4 bits or less, the non-linear circuit with saturation overflow 63 transmits this signal E/Q without modifying it and by, possibly, completing it on the left-hand side by zeros. In both cases a signal X is transmitted, which results or does not result from a saturation operation and which comprises 4 bits, as shown in the fifth line of Table I.

The signal Q which represents the size of the quantizing step and is available at the output 65 of the compression network is also applied to the expansion circuit 66, which performs on the differential PCM signal X an operation which is the opposite of the operation performed in the compression circuit 61, that is to say in the present example it performs a multiplication of the signal X by the signal Q. The signal product X.Q is obtained in a simple manner in the above-mentioned example, where the quantizing step has a value $2^4$, by shifting the bits of the signal X 4 bits to the left and by completing it on the right-hand side with zeros, as shown in the sixth line of Table I. The signal X.Q produced by the expansion circuit 66 thus represents the signal X with the same unit as the unit with which the error signal E is expressed, that is to say a unit equal to the quantizing step of the PCM signal Y to be coded.

The output signal of the expansion circuit 66 is applied to the prediction filter 3, which produces the prediction signal Y'. In accordance with the explications given above, it is possible to represent this prediction filter 3 as having been formed by an assembly 6 of absolute and/or statistical convergence filters arranged in cascade—this assembly having the general transfer function H(z)'/G(z)—and by an output filter 7 having the transfer function [1−G(z)/H(z)].

In addition, FIG. 14 shows a connection between the output 65 of the compression network 64 and the assembly 6 of statistical convergence filters to indicate that the roundoff in each of these filters is performed with a step equal to the variable quantizing step size represented by the signal Q. In a similar manner the connection between the output 65 and the roundoff circuit 22 of the PCM signal Y indicates that the roundoff operation in the circuit 22 is also performed with a step equal to the variable quantizing step size.

In the variable quantizing step encoder of FIG. 14 the local decoder is constituted by the assembly 67, which comprises the compression network 64, the expansion circuit 66 and the statistical convergence filter assembly 6, these elements being interconnected as shown in the Figure. The output of the filter assembly 6 constitutes the output of the local decoder. This local decoder receives the differential PCM signal X which results from a coding with a variable quantizing step and reconstitutes the rounded PCM signal Y' with a step equal to the said variable quantizing step.

The circuit diagram of the remote decoder to be associated with the encoder of FIG. 14 is shown in FIG. 15. This remote decoder has exactly the same construction as the local decoder included in the encoder and its elements have been given the same reference numerals, but provided with an accent notation.

The compression network 64 of the encoder of FIG. 14 comprises the cascade arrangement of a first non-linear operator 68, a syllabic filter 69 and a second non-linear operator 70. The non-linear operator 68 is of the instantaneous type and produces a signal u to correspond with the output signal X of the encoder, by allotting a certain weight in accordance with a law, which will be further described hereafter, to each number of the signal X. The syllabic filter 29 is a low-pass filter having a time constant in the order of duration of a syllable and producing a signal v. According to the invention, this filter 69 is of the statistical convergence type; it can therefore be generally formed by a cascade arrangement of filtering sections such as the sections defined here below, each section having its roundoff (or truncation) device, which effects a roundoff (or a truncation) with a fixed step, the input values of the filter being expressed as a function of this step by an integer. The syllabic filter 69 may be of a very simple construction, for example a purely recursive first-order filter for which it is advantageous to impose certain conditions, which will be further described hereafter. Finally, the non-linear operator 70 operates instantaneously by causing the numbers q of the signal Q, which represents the quantizing step size, to correspond with the numbers of the signal v in accordance with a law, which will be defined hereafter. The numbers of the signal Q are expressed with a unit equal to the quantizing step of PCM signal Y to be coded and are, advantageously, equal to a power of two. The compression network 64' of the remote decoder of FIG. 15 is constructed from the same elements which have been given the same reference numerals, provided with an accent notation.

It has already been shown that, by associating an encoder and a remote decoder operating with the same quantizing step and using the same statistical convergence filter assemblies 6, 6' in each of which the roundoff operations are performed with a step equal to the said step, the remote decoder restitutes the same rounded PCM signal Y' as that applied to the encoders, after a period of time which is necessary to bring the two filter assemblies 6, 6' into line, these filter assembly constituting, in practice, the local decoder and the remote decoder.

To ensure that all this is realized in a system having a variable quantizing step, it is necessary for the compression networks 64 and 64' of the encoder and of the remote decoder to produce the same signal Q, which represents the size of the quantizing step, in response to the same output signal Q of the encoder applied to them. The non-linear operators 68 and 68', which are of the instantaneous type, produce instantaneously the same signal u, in response to the same signal X. The syllabic filters 69, 69', which receive the same signal u and which, according to the invention, are identical filters of the statistical and/or absolute convergence types, produce the same signal v after a period of time necessary for their alignment. Then, the non-linear instantaneous operators 70 and 70' produce instantaneously the same signal Q, in response to the same signal v. Finally, after the time required for the alignment of the syllabic filters 70, 70', the remote decoder of FIG. 15 produces the same PCM signal Y' as that produced by the local decoder 67, incorporated in the encoder of FIG. 14. It was possible to verify in practice that, after a period of time necessary to obtain the alignment of the syllabic filters 69, 69' and the alignment of the filter assemblies 6, 6', the remote decoder of FIG. 15 produces the same rounded PCM signal Y' as the signal applied to the input of the encoder of FIG. 14. It could also be verified that it is possible to arrange several encoders and decoders of this type in cascade, resulting in the same properties as those already explained for the encoders and decoders having a fixed quantizing step.

The characteristics which the compression network 64 and its constituting elements 68, 69, 70 must have to obtain the best possible adaptation of the quantizing step will now be described. The quantizing step is adapted to the best possible extent when the difference signal E in the encoder is at substantially the saturation limit. The compression network 64 to be incorporated in the encoder has for its object to realize the best possible adaptation of the quantizing step by using the information, constituted by the signal X, and by taking the characteristics of the PCM signal, applied to the input of the encoder, into consideration.

An instantaneous operation consisting of the formation of the absolute value $|X|$ of the numbers of the signal X, which is representative of the amplitude of the error signal E, whereafter the predetermined weights are attributed to these numbers $|X|$ in the first element 68 of the compression network 64. This operation is based on several results obtained in actual practice. The possibility that the least significant numbers $|X|$ (from 0 to approximately 4) appear varies little as a function of the quality of the adaptation of the quantizing step, even when in contrast therewith the probability of the appearance of high-value numbers $|X|$ (from 5 to 8) depends to a great extent on the quality of the adaptation. Furthermore, the law in accordance with which the amplitude of the PCM signals to be coded are distributed, leads to a probability that low-value numbers $|X|$ appear, this probability being much greater than the probability that numbers $|X|$ having a high value appear. In practice, these two effects are the reason that in the operator 68 weights which result from a simple approximation of an exponential law, are attributed to the numbers $|X|$: for example, zero weight may be attributed to several low-values numbers $|X|$ and higher weights to the high-value numbers $|X|$, depending on the type of PCM signals to be coded: speech signals and/or data signals.

The syllabic filter 69, which processes the signal u obtained in a manner still to be explained hereafter in the operator 68, is, preferably, a first-order recursive filter having a coefficient $\alpha$ less than 1, and which therefore responds to the statistical convergence property. This filter, which has an integrating function, has a time constant in the order of the duration of one syllable and therefore produces an output signal v, which corresponds with the mean value of the numbers of the signal u, calculated during said period of time. A coefficient $\alpha$ near 1 (for $\alpha = 1 - 1/256$) corresponds with the relatively high time constant imposed on this filter (approximately 8 mS). In accordance with the above-mentioned properties for the first-order filters this results in that, when the syllabic filters 69 and 69' of the encoder and the decoder have different initial conditions and receive the same input signal, the ultimate alignment can only be obtained when this input signal assumes one value out of 256 values. Therefore, the outputs of the syllabic filters of the encoder and the decoder must be prevented from stabilizing, when the PCM signal to be coded has a constant level for a long period of time, on the adjacent, but different, values which, by means of the operator 70 would result in different quantizing steps in the encoder and the decoder.

We shall now look into the manner in which operator 70 is operative and into the measures taken to mitigate the above-mentioned drawback.

By means of this operator 70 a value q of the quantizing step is made to correspond to each number of the signal v furnished by the syllabic filter 69, in accordance with an approximated exponential law of the type:

$$q = q_m 2^{E\left[\frac{v}{A}\right]} \tag{7}$$

In this expression (7):

the expression $E[\ ]$ represents the largest entire value of $v/A$ $q_m$ is the minimum value of quantizing step q which is taken equal to the quantizing step of the linear PCM signal, as it is not necessary to quantize the error signal E with a definition which is better than that of the PCM signal.

A is a constant defining the range of output values v of the syllabic filter to which the same value of the quantizing step is made to correspond.

Adopting an exponential law as defined in formula (7) for forming the quantizing step has for its special object to minimize the influence of the fluctuations which effect the output signal v of the syllabic filter on the determination of the quantizing step q, the amplitude of these fluctuations being independent of the output of the filter.

To mitigate the above-mentioned drawback relative to the final convergence of the syllabic filters of the encoder and the decoder, it is advantageous to relate the value of the constant A of formula (7) to the value of the coefficient $\alpha$ of these filters, in accordance with the relation:

$$A = K \cdot M \tag{8}$$

wherein K is an integer greater than 1 and M is such that $\alpha = 1 - 1/M$.

If, for example, K is chosen to be equal to 2 with a coefficient $\alpha=(1-1/256)$ (that is to say M=256), the above formula (7) becomes:

$$q = q_m{}^2 E\left[\frac{v}{512}\right] \quad (9)$$

From this it can be deduced that, when two syllabic filters having the coefficients $\alpha=(1-1/256)$ are used and by determining the quantizing step q in accordance with formula (9), the final convergence of these two filters is bound to be obtained. Under these circumstances, each time the output signals v and v' of the syllabic filters of the encoder and the remote decoder correspond to the distinct values of the quantizing steps, the values which are reinjected into the memory of these syllabic filters which correspond to the value $v(-1/M)$ and $v'(1-1/M)$, which have been subjected to a truncation so that they only retain the largest entire value, will actually be such that their deviation will be less by at least one unit than the deviation separating v and v'. Thus, there can only be a finite number if the encoder and the decoder operate with different quantizing steps.

It is, finally advantageous to limit the deviations in the output of the syllabic filter 69 to two boundaries, namely a minimum boundary $v_{min}$ and a maximum boundary $v_{max}$. The use of a minimum boundary in the syllabic filter renders it possible to guarantee a loss of stored information. On the other hand, the maximum boundary corresponds to the limit of the range which defines the maximum step used, so to the range of output levels of the syllabic filter. When these boundaries are used, formula (9) can be rewritten which gives the quantizing step:

$$q = q_m{}^2 E\left[\frac{v - v_{min}}{512}\right] \quad (10)$$

wherein $0 \leq v - v_{min} < v_{max}$.

The domain of the output values $v - v_{min}$ of the syllabic filter 69 may, for example, consist of 12 distinct ranges, each having a value equal to 512, see formula (10), and corresponding to the quantizing steps from $q_m$ to $2^{11} \cdot q_m$. The following Table II shows in a practical manner for the above case the agreement formed in the operator 70 between the 12 ranges of the output $v - v_{min}$ of the syllabic filter 69 and the 12 quantizing steps.

TABLE II

| $v - v_{min}$ | [0,512[ | [512,1024[ | [1024,1536[ | .... | [5632,6144[ |
|---|---|---|---|---|---|
| q | $q_m$ | $2q_m$ | $4q_m$ | .... | $2^{11}q_m$ |

For the case considered so far, in which the non-linear circuit with saturation overflow 63 has a linear quantizing law (of the type shown in FIG. 11), the solid curves in FIG. 16 show the response X of the variable quantizer 60 to the difference signal E for the different values of the quantizing steps of the Table II: $q_m$, $2q_m$, $4q_m$ ... etc. The response in the range without saturation, for each step size $\Delta$, is approximated by a segment, for which the step size has been taken into account. It will be easily seen that in this case the ranges of the signal E processed without saturation vary by 6 dB between two consecutive responses.

The non-linear circuit with saturation overflow 63 may alternatively have a non-linear quantizing law and it will be easily understood that in that case the multiplying circuit 66 of the encoder must be preceded by a circuit 71, which has a transfer function opposite to the transfer function of the non-linear circuit with saturation overflow 63, shown by dotted lines in FIG. 14, whereas the multiplying circuit 66' in the remote decoder must also be preceded by a circuit 71', which is identical to the circuit 71 of the encoder and is indicated by means of dotted lines in FIG. 15.

The non-linear circuit with saturation overflow 63 may, for example, have the non-linear quantizing law shown in FIG. 12 and is characterized, as explained already, by a minimum quantizing step used for a first range of the values of E around zero and by a double step of the minimum step, used for two ranges by extending the first range to the saturation point. For this case, the dotted curves in FIG. 16 represent the response X of the variable quantizer 60 to the difference signal E, for the minimum quantizing step values $q_m$, $2q_m$, $4q_m$ ... etc. For each minimum step value, the response in the range without saturation is approximated by a 3-segment curve, formed from a segment around the original segment, which corresponds to a quantization with the minimum step, and two segments by extending the first segment to just the saturation point and in correspondence with a quantization with double the minimum step.

It is advantageous to use a controlled non-linear circuit with saturation overflow 63 to have alternately a linear and a non-linear law when the output signal $v - v_{min}$ varies in the same sense. As can be easily deduced from FIG. 16, we now have a staircase configuration of quantization ranges without saturation of the signal E, which is superior to the situation when always the same quantizing law were used: the width of these ranges varies for approximately 3 dB between two consecutive linear and non-linear laws, whereas it would vary for 6 dB between two consecutive laws of the same nature.

As a complement to Table II, the following table III shows how the domains of output values $v - v_{min}$ of the syllabic filter 69 may be subdivided in the operator 70, to determine 12 minimum quantizing steps ranging from $q_m$ to $2^{11} q_m$ and an alternation of a linear and a non-linear quantizing law.

TABLE III

| $v - v_{min}$ | [0,256[ | [256,512[ | [512,768[ | [768,1024[ | .... | [5632,5888[ | [5888,6144[ |
|---|---|---|---|---|---|---|---|
| q law | $q_m$ linear | $q_m$ non-linear | $2q_m$ linear | $2q_m$ non-linear | .... | $2^{11}q_m$ linear | $2^{11}q_m$ non-linear |

In the most general case a controlled non-linear circuit with saturation overflow 63 may be used, this circuit being controlled so that consecutively M linear or non-linear quantizing laws (M=2 in the above-mentioned example) are obtained for each of the L possible minimum quantizing steps (L=12 in the abovementioned example). Thus, it is possible to obtain a staircase distribution between the quantizing ranges of the signal E, which may be of any desired good quality. It is of course advantageous for the quantizing steps used for those M quantizing laws, to be taken from the L minimum steps which are related to one another in a ratio equal to a power of two. In the same manner as shown in Table III for the case where M=2 and L=12, the domain of the output values $v-v_{min}$ of the syllabic filter 69 will be divided in the operator 70 into L.M distinct ranges, each of these ranges corresponding, in the variable step quantizer 60, a quantization with a law taken from the M laws, with a minimum predetermined step, taken from the L values.

What is claimed is:

1. A digital information transmission system using differential pulse code modulation and comprising an encoder in which the differential PCM signal to be transmitted is formed by quantizing the difference signal between the incoming linear signal and a prediction signal produced by a prediction filter comprising a local decoder receiving the said differential PCM signal, and a remote decoder, the local decoder and the remote decoder comprising filters of the same structure, characterized in that these filters are constructed from one or several filtering sections arranged in cascade, each filtering section being of the purely recursive or non-recursive type with a sole coefficient differing from zero, the roundoff (or truncation) operators which operate in each filtering section and on the incoming linear PCM signal being controlled to realize these rounding (truncating) operations with a quantizing step equal to the quantizing step of the said difference signal, and characterized in that the encoder is preceded by an expansion circuit for converting the compressed PCM signal into a linear PCM signal and the decoder is followed by a compression circuit for converting the linear PCM signal into a compressed PCM signal, the sign of the signal produced by the expansion circuit being changed at the input of the roundoff (or truncation) operator provided between the expansion circuit and the encoder, the initial sign being restored at the output of the said roundoff (or truncation) operator.

2. A transmission system as claimed in claim 1, in which the encoder comprises a first saturation circuit for saturating the difference signal between the incoming linear PCM signal and the prediction signal, characterized in that this encoder comprises inter alia an adder circuit for forming the sum of the said difference signal and the prediction signal, the output of the adder circuit being connected to the cascade arrangement of a compression circuit, an expansion circuit and a roundoff (or truncation) operator, which are identical to the compression circuit arranged behind the decoder, and to the expansion circuit and roundoff (or truncation) operator preceding the encoder, respectively, the signal at the output of the said cascade arrangement being applied to a differential PCM coding device which uses the said prediction signal and a saturation circuit which is identical to the first saturation circuit and producing the differential PCM signal to be transmitted.

3. A transmission system as claimed in claim 1 or 2, in which the quantizing step of the said difference signal is automatically controlled by means of identical compression networks incorporated in the local decoder and the remote decoder and receiving the transmitted differential PCM signal, characterized in that each compression network comprises in cascade a first instantaneous output operator weighting the numbers of the differential PCM signal in accordance with a predetermined law, a syllabic filter formed by one or several filtering sections of the purely recursive or non-recursive type arranged in cascade, each having a sole coefficient differing from zero, and finally a second instantaneous output operator which causes, in accordance with a predetermined law, the number characterizing the size of the quantizing step of the said difference signal to correspond to the output numbers of the filter.

4. A transmission system as claimed in claim 3, characterized in that the first instantaneous output operator has for its function to form the absolute values of the numbers of the differential PCM signal and to weight these absolute values in accordance with a simple approximation of an exponential law.

5. A transmission system as claimed in claim 4, characterized in that the syllabic filter is arranged thus that its output signal v is limited to a minimum value $v_{min}$ and to a maximum value $v_{max}$.

6. A transmission system as claimed in claim 5, characterized in that the syllabic filter is a first-order, purely recursive filter.

7. A transmission system as claimed in claim 6, characterized in that the second instantaneous output operator is arranged for forming a value q of the quantizing step in accordance with the law:

$$q = q_m \, 2^{E[v < v_{min}/A]}$$

where $q_m$ is the minimum value of the said step
A is a constant
$E[v - v_{min}/A]$ represents the largest entire value of $v - v_{min}/A$.

8. A transmission system as claimed in claim 7, characterized in that the constant A is related to the coefficient $\alpha$ of the said first-order purely recursive filter by the relation $A = K[1/1 - \alpha]$, K being an integer greater than 1.

9. A transmission system as claimed in claim 8, characterized in that the second instantaneous output operator divides the domain of the output values of the syllabic filter into L distinct ranges for forming L discrete values of the quantizing steps ranging from $q_m$ to $2^{L-1} q_m$, these L values being used in a linear or segment-wise non-linear quantizer for quantizing the said difference signal between the linear PCM signal and the prediction signal.

10. A transmission system as claimed in claim 9, characterized in that the second instantaneous output operator divides the domain of the output values of the syllabic filter into L distinct ranges for forming L discrete values of the quantizing steps ranging from $q_m$ to $2^{L-1} q_m$, and divides each of said ranges into M distinct sub-ranges, corresponding to M linear and segment-wise non linear quantizing laws, to control at each time instant the quantizing operation on the difference signal, so that it is realized with a quantizing law corresponding to the sub-range to which belongs the value of the syllabic filter output at the said time instant, these quantizing laws being formed from the said L discrete values of the quantizing steps.

* * * * *